United States Patent
Andretta

(10) Patent No.: US 7,304,856 B2
(45) Date of Patent: Dec. 4, 2007

(54) ASSEMBLY FOR HOLDING CIRCUIT CARDS

(75) Inventor: Philip Andretta, Lodi, NJ (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 11/318,471

(22) Filed: Dec. 28, 2005

(65) Prior Publication Data

US 2007/0147015 A1   Jun. 28, 2007

(51) Int. Cl.
*H05K 1/14* (2006.01)

(52) U.S. Cl. .............. 361/741; 361/752; 361/737; 361/796; 361/688; 361/720; 361/753; 361/758

(58) Field of Classification Search ........... 361/752, 361/737, 800, 741, 683, 796, 688, 720, 753, 361/756, 758
See application file for complete search history.

(56) References Cited

U.S. PATENT DOCUMENTS

| | | | | |
|---|---|---|---|---|
| 3,152,219 A | * | 10/1964 | Murray et al. | 174/72 A |
| 3,316,430 A | * | 4/1967 | Riley et al. | 310/204 |
| 4,109,300 A | * | 8/1978 | Reimer | 361/801 |
| 4,602,829 A | * | 7/1986 | De Andrea | 312/223.1 |
| 5,383,793 A | * | 1/1995 | Hsu et al. | 439/327 |
| 5,594,627 A | * | 1/1997 | Le | 361/801 |
| 5,603,628 A | * | 2/1997 | Schapiro, Jr. | 439/327 |
| 5,754,406 A | * | 5/1998 | Hardt et al. | 361/756 |
| 6,437,992 B1 | * | 8/2002 | Carney et al. | 361/796 |
| 6,502,297 B2 | | 1/2003 | Giese et al. | |
| 6,522,554 B1 | | 2/2003 | Gomez et al. | |
| 6,545,611 B2 | * | 4/2003 | Hayashi et al. | 340/686.4 |
| 6,580,616 B2 | | 6/2003 | Greenside et al. | |
| 6,646,868 B2 | | 11/2003 | Ho et al. | |
| 6,698,079 B1 | | 3/2004 | Mimlitch, III et al. | |
| 6,752,276 B2 | * | 6/2004 | Rumney | 211/41.17 |
| 6,771,513 B2 | | 8/2004 | LaMothe et al. | |
| 6,885,565 B2 | * | 4/2005 | Shi | 361/801 |
| 6,908,333 B2 | | 6/2005 | Larson | |

OTHER PUBLICATIONS

"VME Form Extender" Specifications brochure, printed on Dec. 27, 2005 from http://www.bustronic.com/pdf/VMEFormFactorExtender.pdf, 2 pages, brochure undated.

* cited by examiner

*Primary Examiner*—Dean A. Reichard
*Assistant Examiner*—Hoa C Nguyen
(74) *Attorney, Agent, or Firm*—Fogg & Powers LLC

(57) ABSTRACT

An assembly for holding circuit cards may comprise a plurality of slots, each slot being configured to receive a circuit card. At least one slot may be modifiable so as to permit the at least one slot to hold circuit cards having differing depths.

13 Claims, 6 Drawing Sheets

ASSEMBLY FOR HOLDING CIRCUIT CARDS

TECHNICAL FIELD

Embodiments according to exemplary aspects of the invention relate to an assembly for holding printed circuit cards. In particular, various embodiments relate to a chassis for holding printed circuit cards of varying sizes, which may include, for example, Versa Modular Eurocard (VME) standard printed circuit cards and printed circuit cards of other sizes.

BACKGROUND

Electrical devices often include components that are provided on a plug-in circuit card and attached to the device by inserting the card into a connector on a mother board or backplane within the device. For example, many computer designs have processor boards, memory boards, and other types of printed circuit cards that are connected to the device by insertion into a connector on a mother board or backplane.

In some devices, several circuit cards can be connected to a common backplane or motherboard. For example, each circuit card may be provided with a bus connector that is configured to mate with a corresponding electrical connector mounted to the backplane or motherboard. To facilitate proper alignment and installation of several circuit cards, the electrical device may have a chassis having a plurality of slots into which the cards can be inserted.

In some conventional card chassis and/or card cages, the slots for holding the cards have approximately the same dimensions so as to be configured to hold circuit cards having the same dimensions. For example, the slots may be configured to hold VME standard cards, which have standard dimensions, including a depth of 160 mm.

However, in some applications, circuit cards having dimensions other than a standard VME card may be used. For example, some cards may have a depth of 160 mm but may have a variety of heights. Other card sizes also exist, including for example, standard cards having depths that increase from 160 mm in 60 mm increments (e.g., depths of 220 mm, 280 mm, etc.), as well as custom circuit cards having custom depths, which may be greater or less than 160 mm. In the latter case, for example, the assignee of the present application, makes a custom card for use in aerospace applications that has a height of about 184.5 mm, as measured from proximate where the ejection levers mount on the card to the bottom of the card containing the connectors. For the purposes of this disclosure, the depth of a circuit card refers to its dimension in the direction of insertion into the card chassis, e.g., the distance between the end of the card that has the connector (e.g., bus connector) and the opposite end of the card proximate where the levers connect to the cards. The height of a circuit card refers to its dimension measured along a length of a card slot (e.g., perpendicular to the direction of insertion).

Various approaches have been taken to provide adapters that permit cards of differing heights to be used within a single card chassis or card cage assembly. For example, partitions have been provided for use with a card cage assembly to permit the use of smaller cards (e.g., cards having a height of 100 mm) in larger sized card cages (e.g., cages having card slots configured to receive cards having height of 233.35 mm). However, a disadvantage of some partition configurations is that they occupy space that may otherwise be used for a circuit card. In addition, such partitions do not permit the assembly to be modified to hold circuit cards of differing depths. Further, some such partition designs are relatively complex.

To accommodate circuit cards of differing depths, adapters that come in standard size increments (e.g., 60 mm, 120 mm, etc.) have been used. These adapters connect to the connectors on the circuit cards to add depth to a smaller, standard depth card.

As mentioned above, some circuit cards may have a depth that differs from standard circuit card depths. It may therefore be desirable to provide an assembly for holding circuit cards (e.g., a card chassis) that may be configured to hold cards of varying depths and to permit such cards of varying depths to engage with corresponding connectors on a backplane or motherboard. It also may be desirable to provide such an assembly where ejection of the circuit cards, regardless of their depth, may be accomplished via conventional ejection levers typically provided on circuit cards.

It may be further desirable to provide a card cage configuration that can hold circuit cards of varying depths that is relatively simple in design and use.

SUMMARY

The present invention may satisfy one or more of the above-mentioned desirable features set forth above. Other features and advantages will become apparent from the detailed description which follows.

According to an exemplary aspect, as embodied and broadly described herein an assembly for holding circuit cards may comprise a plurality of slots, each slot having a depth and being configured to receive a circuit card. At least one of the slots comprises a pair of ledges disposed along the depth of the slot, the ledges being configured to support a first circuit card having a depth that is less than the depth of the slot. The assembly may further comprise a pair of removable support members, each support member being configured to be placed adjacent to each of the ledges within the at least one slot such that the support members at least partially support a second circuit card having a depth that differs from the first circuit card.

According to yet another exemplary embodiment, an assembly for holding circuit cards may comprise a plurality of slots, each slot being configured to receive a circuit card. At least one of the plurality of slots may be modifiable so as to permit the at least one slot to hold circuit cards having differing depths.

In the following description, certain aspects and embodiments will become evident. It should be understood that the invention, in its broadest sense, could be practiced without having one or more features of these aspects and embodiments. It should be understood that these aspects and embodiments are merely exemplary and explanatory and are not restrictive of the invention.

BRIEF DESCRIPTION OF THE DRAWINGS

The drawings of this application illustrate exemplary embodiments of the invention and together with the description, serve to explain certain principles. In the drawings.

DETAILED DESCRIPTION

Figure 1:
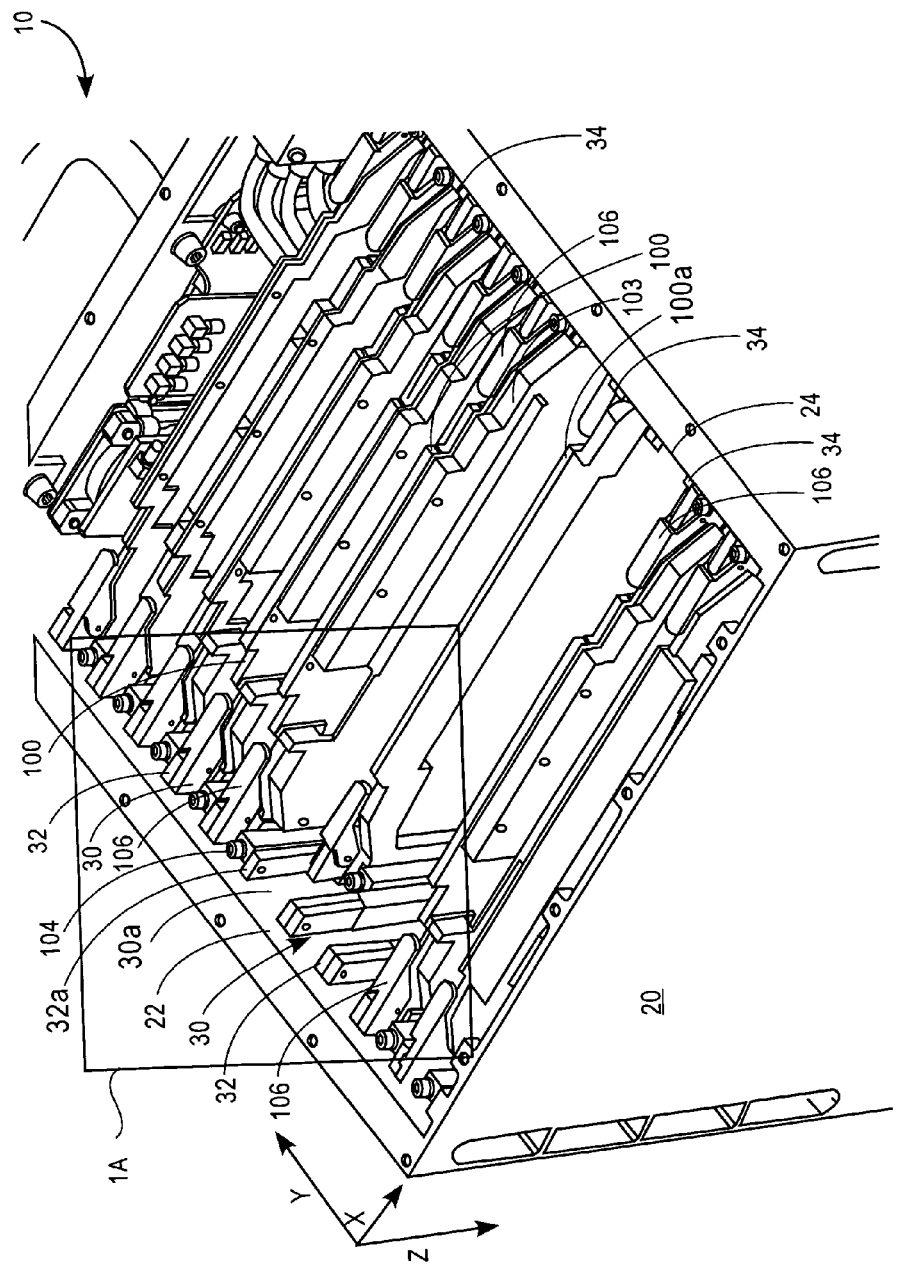
FIG. 1 is a partial perspective view of a card cage assembly filled with circuit cards according to an exemplary embodiment.

An exemplary embodiment of a chassis assembly configured to hold a plurality of circuit cards of varying depths is illustrated in FIG. 1. As illustrated, the assembly 10 may comprise a chassis (e.g., housing) 20 comprising a plurality of slots 30 configured to hold one or more circuit cards 100. A series of rails 32 and 34 may be disposed along a length of the housing 20 on opposite interior surfaces 22 and 24 of the housing 20 and in substantial alignment with each other. It should be understood that the rails 34 are substantially symmetrical to and in alignment with the rails 32.

A pair of opposite rails 32 and 34 partially define a slot 30 configured to receive a circuit card 100, with the rails 32 and 34 being configured to support the circuit cards 100. The circuit cards 100 are advanced into the respective slots 30 through open ends of the slots 30 at the top of the housing 20, as shown from the view in FIG. 1. The cards 100 engage with various connectors 1000 (e.g., bus connectors) and the like positioned proximate the bottom of the housing 20, as shown partially in FIG. 2. For example, the various connectors 1000 with which the circuit cards 100 engage may be provided on a backplane or motherboard disposed proximate the bottom of the housing 20 with respect to the view (e.g., orientation) of the housing shown in FIG. 1. Thus, the rails 32 and 34 defining the slots 30 facilitate the proper alignment of the circuit cards 100 as they are advanced into the housing 20 and into connection with the connectors 1000.

Figure 4:
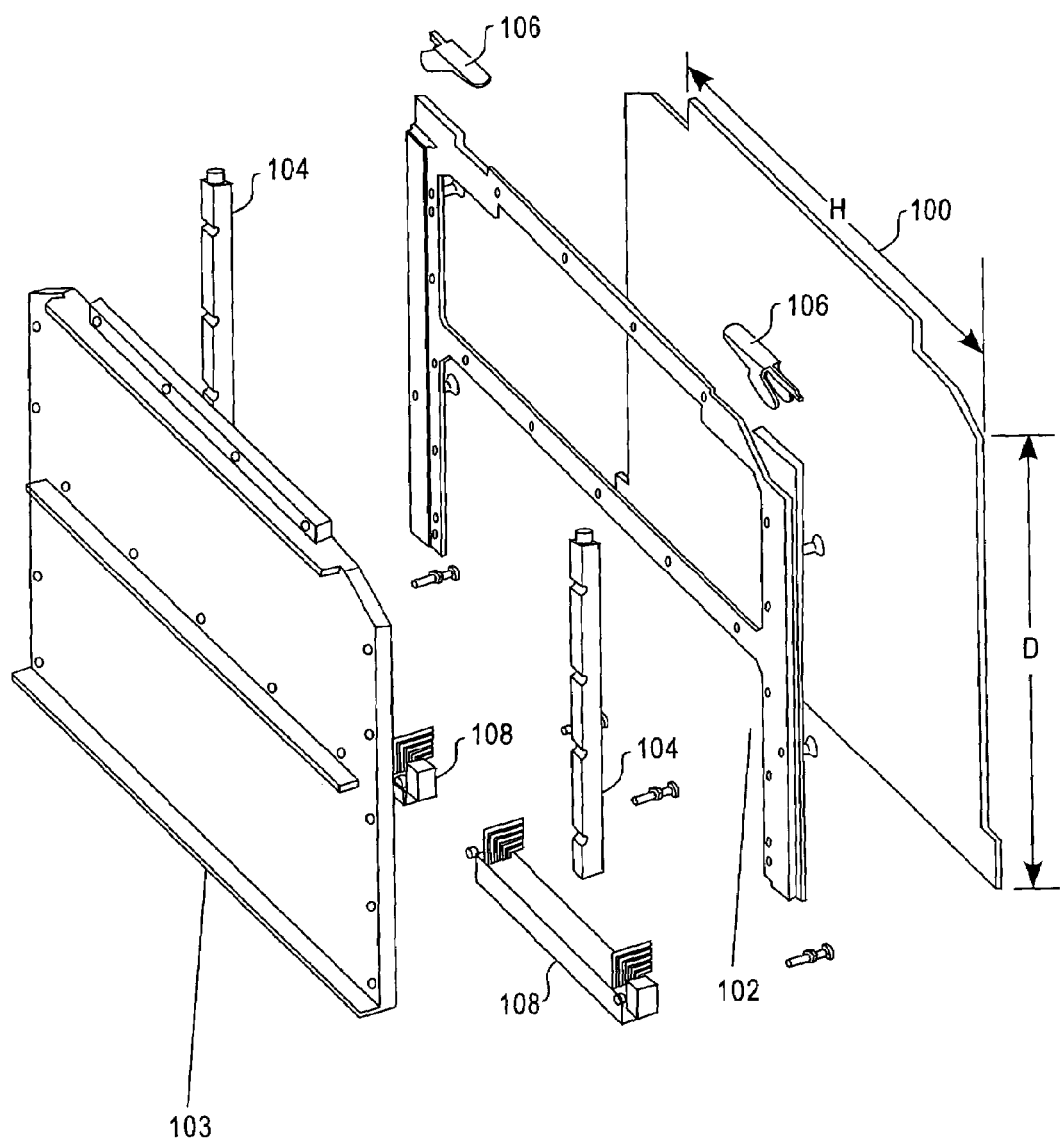
FIG. 4 is an isometric perspective view of a circuit card according to an exemplary embodiment.

FIG. 4 shows an isometric view of an exemplary embodiment of a circuit card 100 and various corresponding components. Typically, circuit cards 100 have a height H and a depth D, with the height extending in the direction X and the depth D extending in the direction Z in FIG. 1 when the card 100 is inserted in a slot 30. The card 100 may comprise substantially conventional parts, generally known to those skilled in the art, including a frame 102. A plate 103 that acts as a heat sink for transferring heat from the card 100 also may be provided, as shown in FIG. 4. The plate 103 may be made of, for example, aluminum. A pair of retainers 104 may be attached to opposite ends of the frame 102. The retainers 104 include a screw at a top end that can be turned so as to increase or decreases the thickness of the retainer 104. In this way, the retainers 104 may be adjusted as needed such that the card 100 is held firmly in place in a card slot. One or more connectors 108 (e.g., bus connectors) may be provided at a bottom end of the card 100 and configured to engage with corresponding connectors on a motherboard or backplane disposed proximate a bottom of the card chassis.

Each card 100 also may be provided with a pair of levers 106 situated at the top of the card 100 on opposite ends thereof, as illustrated in FIG. 4. The levers 106 may be secured via pins (not shown) to the frame 102 and may pivot relative to the card 100. When the card 100 is positioned within a card slot, the levers 106 typically bear against the top ends of one pair of rails defining the slot such that the card 100 is supported in the slot. When it is desired to remove a card 100 from the slot, the levers 106 are pulled up such that the bottoms of the levers 106 push against the tops of the rails 32 and 34 (shown in FIGS. 1 and 1A) to provide a counterforce which acts to pull the circuit card 100 out of disengagement with the connector at the bottom of the housing 20. Those having skill in the art are familiar with how the levers 106 operate to facilitate ejections and/or insertion of the circuit card 100 in the slot 30. By way of example only, the levers 106 may be levers that meet the requirements of DSCC (Defense Supply Contractor Columbus) Drawing Number 84191.

Because the levers 106 interact with a top portion of the rails defining a card slot in conventional card holders, as explained above, in order for the ends of the cards opposite the ends on which the levers are disposed to properly engage with the mating connectors provided on a motherboard or backplane of the card cage assembly, the cards must all have the same depth, as measured, for example, from approximately the lever to the bottom end of the circuit card containing the connectors. Thus, typically, conventional assemblies for holding circuit cards are configured to hold circuit cards that have the same depth.

According to various exemplary embodiments herein, however, one or more slots 30 of the assembly 10 may be modified so as to permit cards of varying depths to be inserted within the slots 30, while also permitting proper engagement of the cards with connectors on a backplane or motherboard, as well as engagement of the levers 106 with a portion of the rails or other surface so as to permit insertion and ejection of the cards 100.

Figure 2:
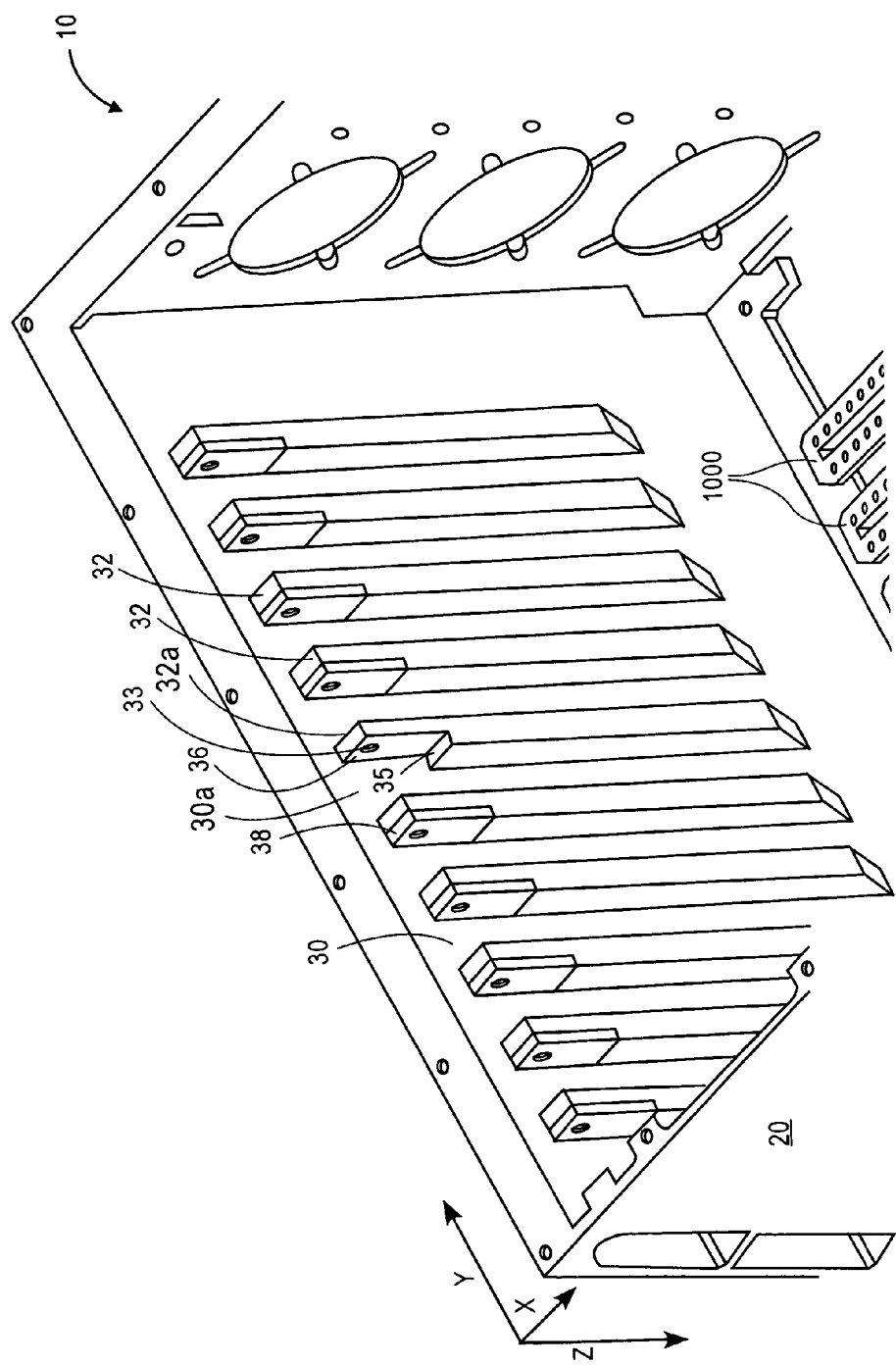
FIG. 2 is a partial perspective view of the card cage assembly of FIG. 1.

Referring now to FIG. 2, a partial perspective view of the housing 20 and rails 32 of the assembly 10 of FIG. 1 is shown, without circuit cards 100 being inserted. As shown in FIG. 2, a recess 36 may be provided in one or more pairs of rails 32 and 34 so as to define a ledge 35. As mentioned above, corresponding rails 34 that are in alignment with the rails 32 and which are not shown in FIG. 2 have substantially symmetrical configurations as rails 32. Thus, it should be understood that the description of the rails 32, recess 36, ledge 35, and removable support 38 which follows also applies to the corresponding rails 34. The recess 36 may extend from a top end of the rail 32 to a position along a depth of the rail (i.e., in direction Z shown in FIG. 2). The extent of the recess 36 may be chosen depending on the varying depths of the circuit cards that it may be desirable to hold in the assembly 10, as will be understood further from the explanation below. The thickness of the recess 36, as measured in the Y-direction shown in FIG. 2, may be selected such that the ledge 35 provides a sufficient area against which the levers 106 may act against to eject the card 100 from the slot 30. By way of example only, the thickness of the recess 36 (and removable support member 38 discussed below) may range from about 3.38 mm to about 3.63 mm. Also, the width of the recess 36 (and removable support member 38) as measured in the X direction shown in FIG. 2 may be substantially equal to the width of the corresponding rail 32 or 34. Again, by way of example only, the width of the recess (and removable support member 38) may be about 9.5 mm.

Figure 3:
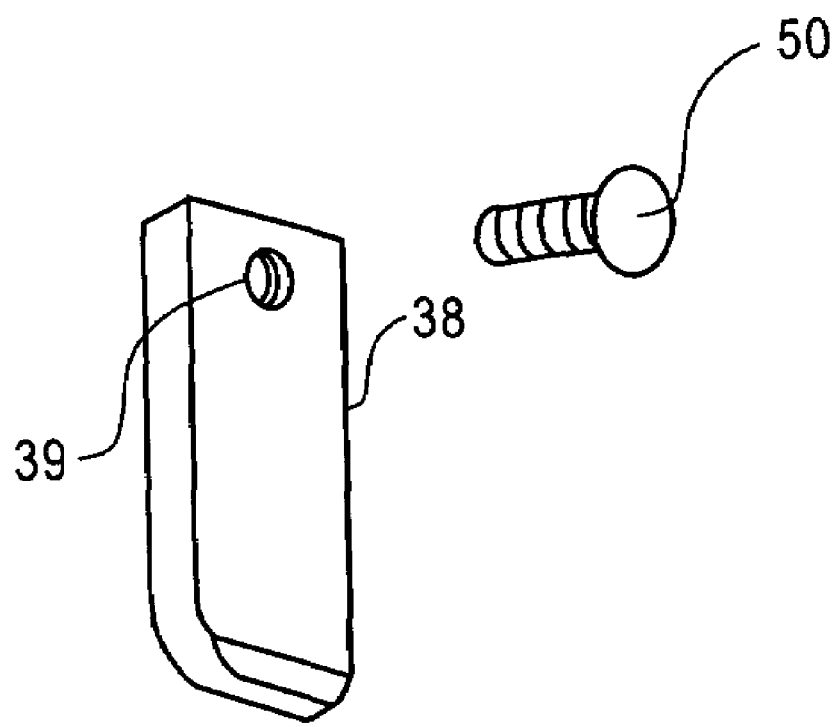
FIG. 3 is a perspective view of an exemplary embodiment of the removable support member of FIG. 1.

A removable support member 38 may be configured to be received in the recess 36 and attached via a securement mechanism, such as, for example, a screw, a bolt, a pin, or other securement mechanism to a portion of the rail 32 above the recess 36. FIG. 3 illustrates a perspective view of the removable support member 38 in a removed position. As shown in FIG. 3, in some exemplary embodiments, the support member 38 may be substantially in the form of a block (e.g., a rectangular block) provided with a threaded hole 39 configured to receive a securement mechanism which may be in the form of a screw 50, for example. A corresponding throughhole 33, which may be countersunk, also configured to receive the screw 50 may be provided in the rail 32 so as to secure the support member 38 to the rail 32. According to various exemplary embodiments, the support member 38 may be a portion of the rails 32 and 34 that is removed to form the recess 35 in each rail 32, 34. As shown in the exemplary embodiment of FIG. 3, the edge of the support member 38 that faces the interior corner of the recess 36 my be slightly beveled due to machining tolerances when attempting to cut a square edge from the rail 32, 34 to form the recess 36. In such circumstances, the interior corner of the recess 36 may be beveled in a corresponding manner. The support member 38, like the rails 32 and 34, may be made out of aluminum, for example.

With the exception of the rail labeled 32a, FIG. 2 illustrates each of the rails 32 having a removable support member 38 secured in position in the recess 36. The rail 32a illustrates the removable support member 38 being removed so as to expose the recess 36 and the ledge 35.

Thus, as depicted by FIG. 2, when the removable support member 38 is secured to the rail 32 within the recess 36, the support member 38 is substantially flush with the top surface and a side surface of the rail 32 facing toward a corresponding slot 30. With the support member 38 in place, the ledge 35 is not exposed. To ensure a mating connection, a circuit card positioned in a slot 30 with the removable support member 38 in position must have a depth sufficient to permit the levers 106 of the card to rest on the top end of the rails 32 and 34, and support members 38, while the end of the card opposite the levers 106 engages with corresponding connectors 1000 provided on a motherboard or backplane disposed proximate the bottom of the chassis housing 20 shown in FIG. 2.

On the other hand, when the support member 38 is removed from the recess 36, as shown by rail 32a in FIG. 2, the recess 36 and ledge 35 are exposed. By removing the support member 38 and thereby exposing ledges 35 on a pair of rails 32 and 34, a circuit card having a depth that is smaller than the depth measured from the top of the rails 32 and 34 to the backplane or motherboard (e.g., the depth of a slot 30) may be inserted into the corresponding card slot 30a. The exposed recesses 36 will permit such a card of smaller depth to fall down into a recessed position in the card slot 30a until its levers 106 abut against the ledges 35. Assuming the position of the ledges 35 is selected based on the depth of the card (e.g, as measured from the bottom of the levers 106 to the end of the card provided with the connectors), the end of the card opposite to the levers 106 may engage with the corresponding connectors 1000 situated on a backplane or motherboard (e.g., proximate the bottom) of the housing 20.

Figure 1A:
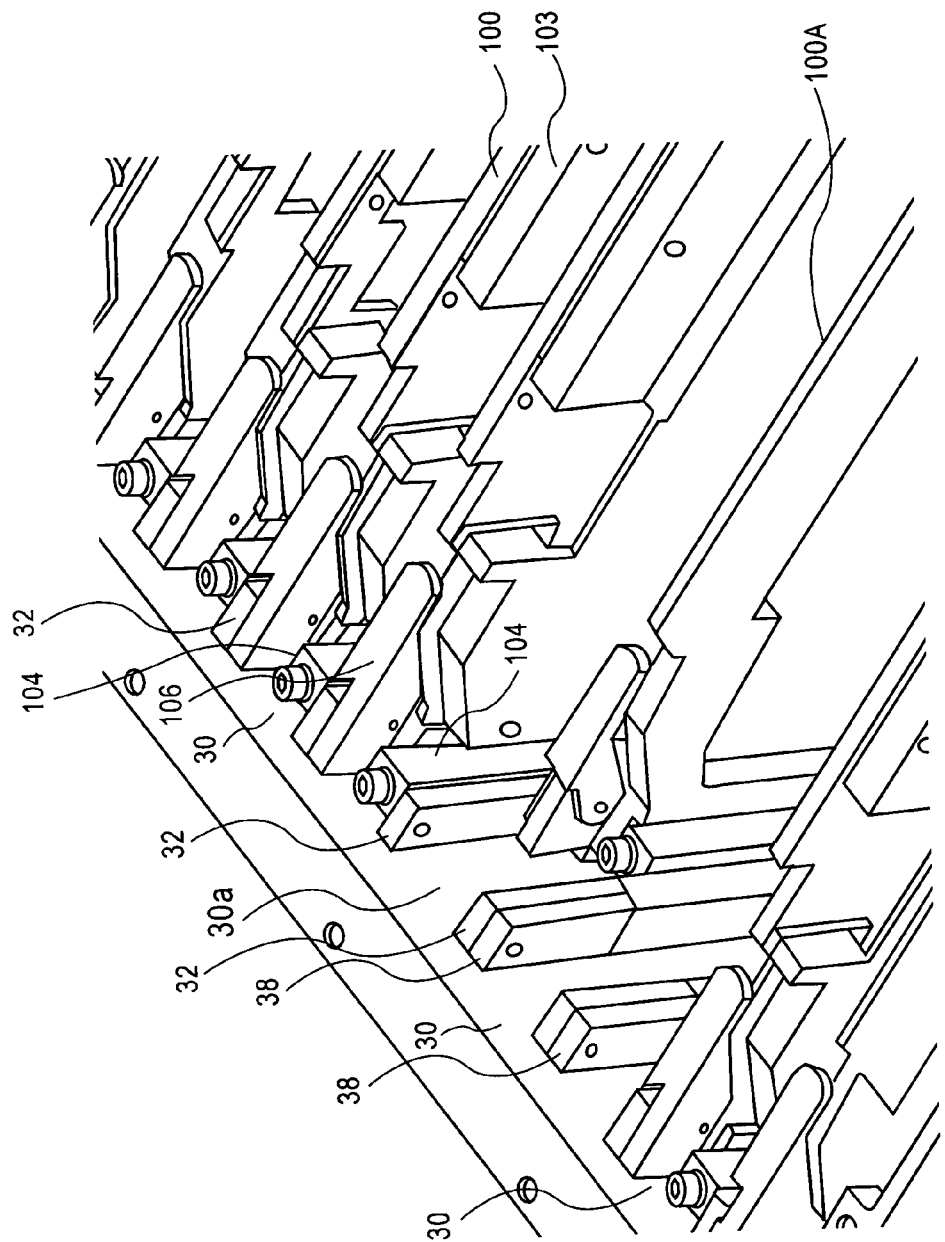
FIG. 1A is a close-up view of portion A of the card cage assembly of FIG. 1.

FIG. 1A shows a close up view of a portion of the assembly 10 from section 1A of FIG. 1. In FIG. 1A, a plurality of circuit cards 100 of larger depth are inserted into card slots 30 and a circuit card 100a of smaller depth is inserted into card slot 30a. The slots 30 in FIG. 1A have the removable support members 38 secured to a corresponding pair of rails 32 and 34 (not shown) such that when the cards 100 are inserted into the slots 30, the levers 106 engage (e.g., rest on top of) the support members 38 so as to support the cards 100 in appropriate position within the slots 30. Assuming the depth of the cards 100 are sufficient, the cards 100 will form a mating connection with connectors (e.g., bus connectors) disposed proximate a bottom of the housing 20. In contrast to the slots 30, the slot 30a has the removable support members 38 removed therefrom (e.g., removed from rail 32a and the corresponding rail 34 (not shown)). Thus, the card 100a having a smaller depth than the cards 100 may drop down into the slot 30a until its levers 106a engage the ledges 35 of the rail 32a and the corresponding rail 34 (not shown) that are exposed due to the removal of the support members 38. As depicted in FIG. 1A, the card 100a is in a recessed position within the slot 30a and spaced from the top of the rail 32a and its corresponding rail 34 (not shown).

Although FIGS. 1, 1A, and 4 depict each of the rails 32 and 34 in the card chassis being provided with a recess 36 and removable support member 38, it should be understood that any number of pairs of rails 32 and 34 could be provided with such a recess 36 and removable support member 38. For example, one or more pairs of rails 32 and 34 may include a recess 36 and support member 38, while remaining of rails 32 and 34 do not include such a recess 36 and support member 38.

Further, differing pairs of rails 32 and 34 may be provided with recesses 36 and corresponding removable support members 38 having differing sizes (e.g., differing depths). In this way, it may be possible to hold circuit cards having varying depths (e.g., more than two differing depths) within the card chassis assembly. As mentioned above, the depth of the recesses 36 (e.g., the distance from the top end of a pair of rails 32 and 34 that the ledges 35 are positioned) may be selected based on, for example, the differing circuit card dimensions that it may be desirable to hold within a slot 30. For example, assuming a slot 30 is configured to hold a card of a larger depth when the removable support members 38 are in place in the recesses 36 defined by the pair of rails 32 and 34 that correspond to the slot 30, the depth of the recesses 36 may be selected based on the difference between the depths of the larger depth circuit card and a smaller depth circuit card that it may be desired to hold in the slot 30. In other words, the ledges 35 may be positioned at a distance from the top end of the pair of rails 32 and 34 that is substantially equal to the difference between the depths of the larger and smaller depth cards (e.g., as measured approximately from the levers 106) such that when the removable support member 38 is removed, the smaller depth card will fall into the slot 30 until the levers 106 come to rest on the ledges 35 and will be able to engage with the connectors at an opposite end of the housing from which the card is inserted.

By way of example only, it may be desirable for a card chassis to hold both VME standard circuit cards, which have a depth of 160 mm measured from the levers 106, and also to hold custom size circuit cards, for example having a depth of about 184.5 mm. In such case, the rails 32 and 34 defining a slot 30 may have a depth such that when a custom depth circuit card is inserted in the slot 30 and is supported by the tops of the rails 32 and 34 and the support members 38 secured in position in the recesses 36, the custom depth card will engage with the appropriate connectors located proximate the bottom of the card cage assembly (e.g., on a backplane or motherboard). To permit the slot 30 to be modified to also accommodate (e.g., hold) the smaller 160 mm depth card, the recess 36 on each of the pair of rails 32 and 34 may be sized such that the respective ledges 35 are positioned approximately 24.5 mm from the top end of the pair of rails 32 and 34. In this way, when the removable support members 38 are removed from the recesses 36 in the rails 32 and 34, the smaller depth card may fall further into the slot 30 until its levers 106 come to bear against the ledges 35, while the end of the card opposite the levers 106 are able to engage with one or more mating connectors on a backplane or motherboard.

Other common circuit card depths, in addition to 160 mm, include 220 mm, 280 mm, and upward in 60 mm increments. In addition, custom sized cards may exist and may have a variety of differing depths. Based on the principles and teachings above, those skilled in the art will understand how to modify the slot/rail depths, recess depths, and corresponding ledge positions so as to be able to modify the slots to appropriately hold cards having a variety of differing depths.

Figure 5:
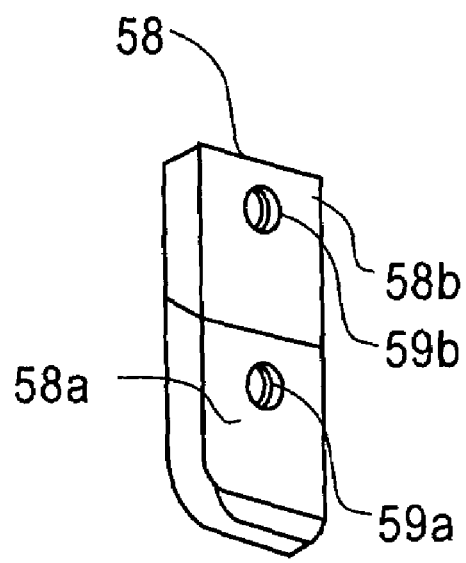
FIG. 5 is a perspective view of a removable support member according to another exemplary embodiment.

According to various other exemplary embodiments, it is envisioned that one or more card slots may be modified such that an individual slot may be configured to hold circuit cards of more than two differing depths. By way of example, a removable support member may comprise two or more individual portions that when assembled together create a support member having a depth substantially equal to the depth of the recess. Each individual portion may be configured to be received in a recess provided in a rail and attached via a securement mechanism, such as, for example, a screw, a bolt, a pin, or other securement mechanism to a portion of the rail above the recess. FIG. 5 illustrates an exemplary embodiment of a removable support member 58 comprising two individual portions 58a and 58b, each having a threaded hole 59a and 59b that may be configured to receive screws, in a manner similar to that discussed above with reference to FIG. 3. Throughholes, for example countersunk throughholes, corresponding to 59a and 59b also may be provided on a rail for securing the portions 58a and 58b to the rail a manner similar to that discussed above with reference to FIGS. 2 and 3. When both portions 58a and 58b of removable support member 58 are placed in a recess 36 of each of a pair of rails 32 and 34, a relatively larger depth circuit card may be placed in the card slot 30 corresponding to that pair of rails. When both portions 58a and 58b forming the support member 58 are removed from the recesses 36, a relatively smaller depth circuit card may be placed in the corresponding slot, in a manner similar to that discussed above with reference to FIG. 2. In yet another modification, however, portion 58a only may be placed in the recesses 36 and portion 58b forming the upper portion of the support member 58 may be removed. In this configuration, a ledge is created by the top of the portion 58a. The ledges formed by the top of the portions 58a is positioned at a higher position than the ledges 35 formed by the recesses 36 provided in a pair of rails 32 and 34. Thus, when only portion 58a is in place, the corresponding slot 30 may be configured to hold a circuit card having an intermediate depth between the relatively larger depth and relatively smaller depth circuit cards. Those skilled in the art would appreciate that the removable support member 58 may comprise any number of individual portions such that the corresponding slot may be modified to hold any number of differing circuit cards having differing depths.

When used herein, references to top, bottom, and the like may be understood to be referring to directional relationships based on the views of the various devices and elements illustrated in the figures. Those having skill in the art will understand that such references may change depending on factors such as, for example, the orientation of the actual devices and/or elements for a particular application. Thus, for example, if the card cage assembly of FIGS. 1, 1A, or 2 were rotated 90 degrees, the "top" and "bottom" of the card cage assembly, rails, and other elements illustrated in those figures may become the "front" and "back" respectively.

It should be understood that sizes, configurations, numbers, and positioning of various structural parts and materials used to make the above-mentioned parts, such as for example, the dimensions of the recesses and removable support members, are illustrative and exemplary only. One of ordinary skill in the art would recognize that those sizes, configurations, numbers, positioning, materials, and/or other parameters can be changed to produce different effects, desired characteristics, and/or to achieve different applications than those exemplified herein.

It will be apparent to those skilled in the art that various modifications and variations can be made to the structure and methodology of the present invention. Thus, it should be understood that the invention is not limited to the examples discussed in the specification. Rather, the present invention is intended to cover modifications and variations. Other embodiments of the invention will be apparent to those skilled in the art from consideration of the specification and practice of the invention disclosed herein.

What is claimed is:

1. An assembly for holding circuit cards, the assembly comprising:
    a plurality of slots, each slot having a depth and being configured to receive a circuit card,
    wherein at least one of the slots comprises a pair of ledges disposed along the depth of the slot, the ledges being configured to support a first circuit card having a depth that is less than the depth of the slot; and
    a pair of removable support members, each support member being configured to be placed adjacent to each of the ledges within the at least one slot such that the support members at least partially support a second circuit card having a depth that differs from the first circuit card.

2. The assembly of claim 1, wherein the removable support members comprise blocks.

3. The assembly of claim 1, wherein each removable support member comprises a plurality of individually removable portions.

4. The assembly of claim 1, further comprising a housing configured to enclose the plurality of slots.

5. The assembly of claim 1, wherein the depth of the second circuit card is greater than the depth of the first circuit card.

6. The assembly of claim 5, wherein the depth of the first circuit card is 160 mm.

7. The assembly of claim 1, wherein the depth of the second circuit card is substantially equal to the depth of the slots.

8. The assembly of claim 1, wherein each of the plurality of slots defines a first open end configured to receive the circuit card and a second end opposite the first end and configured to be disposed proximate at least one electrical connector configured for mating engagement with an electrical connector provided on a circuit card.

9. The assembly of claim 1, further comprising a pair of rails associated with each slot.

10. The assembly of claim 9, wherein each rail of the pair of rails associated with the at least one slot comprises a recessed portion, the recessed portions defining the pair of ledges.

11. The assembly of claim 10, wherein the removable support members are configured to be removably positioned in the recessed portions.

12. The assembly of claim 11, wherein each of the removable support members is configured to be respectively removably secured to each rail of the pair of rails.

13. The assembly of claim 1, wherein the ledges are disposed along the depth of the at least one slot such that the ledges are configured to support the first circuit card so as to permit the first circuit card to engage an electrical connector configured to provide electrical connectivity to an electrical device.

* * * * *